(12) United States Patent
Hasegawa et al.

(10) Patent No.: US 9,230,595 B2
(45) Date of Patent: Jan. 5, 2016

(54) ERROR CORRECTION METHOD AND DATA REPRODUCTION DEVICE

(75) Inventors: Yuka Hasegawa, Osaka (JP); Hidemi Takahashi, Osaka (JP); Yukio Sugimura, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1062 days.

(21) Appl. No.: 13/314,971

(22) Filed: Dec. 8, 2011

(65) Prior Publication Data

US 2012/0084623 A1 Apr. 5, 2012

Related U.S. Application Data

(63) Continuation of application No. PCT/JP2010/003883, filed on Jun. 10, 2010.

(30) Foreign Application Priority Data

Jun. 10, 2009 (JP) .................................. 2009-139279

(51) Int. Cl.
*G11C 29/00* (2006.01)
*G11B 20/18* (2006.01)
(Continued)

(52) U.S. Cl.
CPC ......... *G11B 20/1833* (2013.01); *H03M 13/293* (2013.01); *H03M 13/2909* (2013.01);
(Continued)

(58) Field of Classification Search
CPC ................... G11B 20/1833; G11B 2020/1287;
G11B 2020/1476; G11B 2020/1836; G11B 2220/215; G11B 2220/2562; G11B 2020/1853; H03M 13/3707; H03M 13/2909; H03M 13/293
USPC .......................... 714/755–756, 785–786, 769
See application file for complete search history.

(56) References Cited

U.S. PATENT DOCUMENTS

| 6,047,395 A * | 4/2000 | Zook .............................. 714/756 |
| 6,678,859 B1 | 1/2004 | Senshu |

(Continued)

FOREIGN PATENT DOCUMENTS

| JP | 2001-148171 | 5/2001 |
| JP | 2001-273729 | 10/2001 |

(Continued)

OTHER PUBLICATIONS

International Search Report issued in International Patent Application No. PCT/JP2010/003883, mailed Jul. 6, 2010.

*Primary Examiner* — Guy Lamarre
(74) *Attorney, Agent, or Firm* — McDermott Will & Emery LLP (57) ABSTRACT

The error correction processing includes: data reproduction processing of reproducing recording data, constituted by a plurality of data units each made of a plurality of bits, from a recording medium sequentially; error correction processing of performing error correction in the row direction and error correction in the column direction at least once for an error correction code block that has the reproduced recording data arranged in the row direction over a plurality of rows; determination processing of determining whether uncorrectable data is left behind after execution of the error correction processing; and erasure correction processing of performing, when it is determined that uncorrectable data is left behind, column-direction error correction considering data constituting at least one row of the error correction code block as erasure data, even in cases where uncorrectable data in the error correction in the row direction is not left behind.

14 Claims, 7 Drawing Sheets

(51) Int. Cl.
*H03M 13/29* (2006.01)
*H03M 13/37* (2006.01)
*G11B 20/12* (2006.01)
*G11B 20/14* (2006.01)

(52) U.S. Cl.
CPC ... *H03M13/3707* (2013.01); *G11B 2020/1287* (2013.01); *G11B 2020/1476* (2013.01); *G11B 2020/1836* (2013.01); *G11B 2020/1853* (2013.01); *G11B 2220/215* (2013.01); *G11B 2220/2562* (2013.01)

(56) References Cited

U.S. PATENT DOCUMENTS

2002/0196718 A1 12/2002 Okazaki et al.
2007/0011582 A1 1/2007 Moriyama et al.

FOREIGN PATENT DOCUMENTS

| JP | 3459225 | 8/2003 |
| JP | 2004-288310 | 10/2004 |
| JP | 2005-228417 | 8/2005 |

\* cited by examiner

ERROR CORRECTION METHOD AND DATA REPRODUCTION DEVICE

CROSS-REFERENCE TO RELATED APPLICATION

This is a continuation of PCT International Application PCT/JP2010/003883 filed on Jun. 10, 2010, which claims priority to Japanese Patent Application No. 2009-139279 filed on Jun. 10, 2009. The disclosures of these applications including the specifications, the drawings, and the claims are hereby incorporated by reference in their entirety.

BACKGROUND

The present disclosure relates to an error correction method, and a data reproduction device, of performing error correction for recording data read from a recording medium.

In conventional optical disc reproduction devices, recording data read from an optical disc is stored into a buffer memory for error correction processing and transfer to a host computer. In such optical disc reproduction devices, the addresses of frames, sectors, and ECC blocks in the buffer memory are specified by detecting various types of sync patterns (sync patterns included in frames, frame sync codes indicating the heads of sectors, and IDs indicating head sectors of ECC blocks).

A data reproduction device disclosed in Japanese Patent No. 3459225 (Patent Document 1) reinforces interpolation of various types of sync patterns for preventing failure in correspondence between addresses and data in a buffer memory due to detection omission, false detection, abnormal interpolation, etc. of sync patterns that might occur from fingerprints, claws, etc. on an optical disc.

A data reproduction device disclosed in Japanese Patent No. 4143452 (Patent Document 2) is provided with an address generation means that, when a sync code is not detected for a predetermined number of times consecutively, interpolates frame addresses for a plurality of frames appearing during and after this non-detection time period, and performs PO erasure correction for a frame, out of the plurality of frames, in which the frame address generated by the interpolation does not match with a frame address calculated based on only the sync code.

SUMMARY

In Patent Document 1, the correspondence between addresses and data in the buffer memory can be secured. However, in the case that the recording quality of the optical disc is poor, data stored in the buffer memory may be incorrect because of suspension and restart of data recording at the time of data edition and rewrite, etc., and thus may not be reproduced normally even if error correction is performed. Such a problem tends to occur, in particular, when data of at least one sector has become incorrect because frames and sectors have been resynchronized by interpolation while an anomaly of a sync code has been missed.

In Patent Document 2, as in Patent Document 1, the correspondence between addresses and data in the buffer memory can be secured, and the position at which an anomaly of a sync code has occurred can be considered as a target of error correction. However, in the cases that the recording quality of the optical disc and the quality of the reproduced signal are poor and that suspension and restart of data recording are performed at the time of data edition and rewrite, for example, whether data in question is actually the data in the error correction target block cannot be determined if the sync code can be read as a different sync code and if data in the correction block is wrong due to recording deviation. In such a case, data may not be reproduced normally even if error correction is performed.

In view of the problems described above, it is an objective of the present disclosure to reproduce data recorded on a recording medium normally.

To attain the above objective, the present disclosure includes: data reproduction processing of reproducing recording data, constituted by a plurality of data units each made of a plurality of bits, from a recording medium sequentially while detecting a sync pattern included in each data unit; error correction processing of performing error correction in a row direction and error correction in a column direction at least once for an error correction code block that has the recording data reproduced in the data reproduction processing arranged in the row direction over a plurality of rows; determination processing of determining whether uncorrectable data is left behind after execution of the error correction processing; and erasure correction processing of performing, when it is determined that uncorrectable data is left behind in the determination processing, error correction in the column direction considering data constituting at least one row of the error correction code block as erasure data, even in cases where uncorrectable data in the error correction in the row direction is not left behind.

According to the present disclosure, when uncorrectable data is left behind, error correction in the column direction is performed considering a sector having the uncorrectable data left behind in an error correction code block as erasure data, even in cases where uncorrectable data in the error correction in the row direction is not left behind. Therefore, in the case that a data unit made of a plurality of bits arranged in the row direction becomes incorrect, which may occur when it is determined that an anomaly has occurred in a sync pattern and thus resynchronization is performed, such error correction that has been conventionally unattainable can be attained, and thus data can be reproduced normally with higher probability.

Thus, the present disclosure has an advantage of permitting such error correction that has been conventionally unattainable and thus being able to reproduce data normally with higher probability.

DETAILED DESCRIPTION

Embodiments of the present disclosure will be described hereinafter with reference to the accompanying drawings.

Note that, in the embodiments to follow, components having similar functions are denoted by the same reference characters and will not be described repeatedly.

First Embodiment

A data reproduction device of the first embodiment of the present disclosure reproduces recording data recorded on a digital versatile disc (DVD) 100 (see FIG. 3) as an optical disc.

<Sector Structure of DVD 100>

Figure 1:
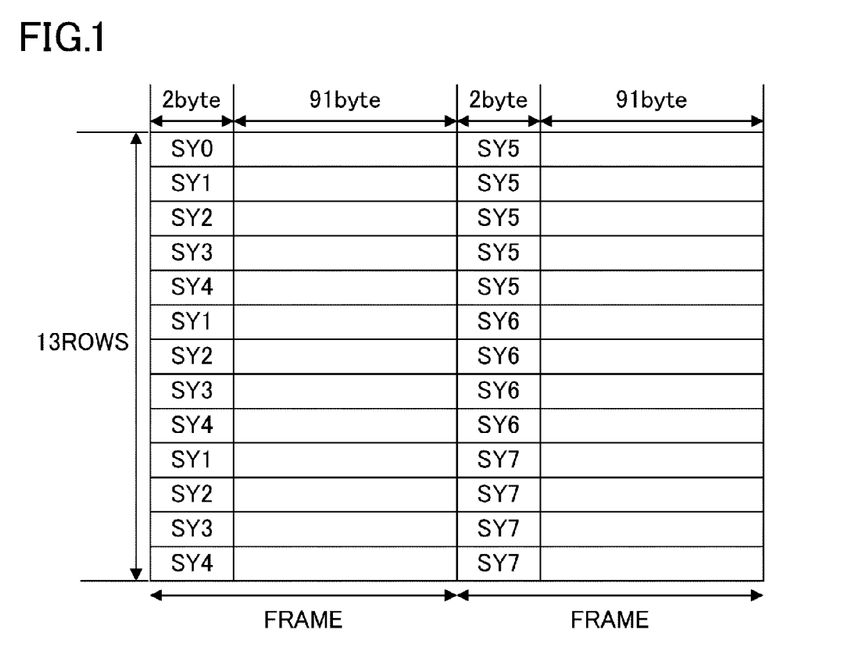
FIG. 1 is a view illustrating a sector structure of a DVD.

The sector structure of the DVD 100 will be described with reference to FIG. 1.

As recording data on the DVD 100, data of 91 bytes and a sync pattern (SYNC) of two bytes indicating the head of the data constitute one frame (second data group).

A total of 26 frames constitute one sector (first data group). The first four bytes of data of the sector is used for the sector number (identification (ID)). The position of a frame (frame address) in the sector can be specified uniquely by a combination of sync patterns of two consecutive frames. Since the first sync pattern (SY0), out of the 2-byte sync patterns, is placed only at the head of the sector, the position of SY0 can be specified as the head of the sector.

<Error Correction Code Block>

Figure 2:
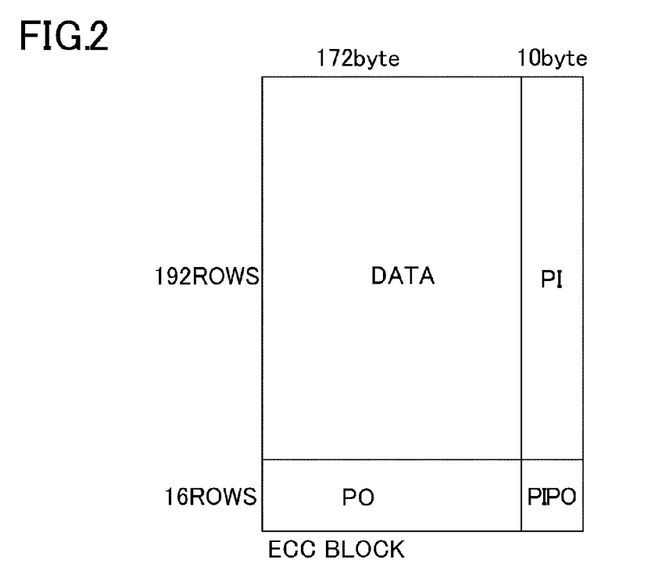
FIG. 2 is a view illustrating an error correction code block of a DVD.

Next, an error correction code (ECC) block will be described with reference to FIG. 2. Data of 182 bytes (91 bytes+91 bytes) of two frames from the head of each sector constitute one row. The last 10 bytes of each row are used as Parity of Inner-Code (PI), and the thirteenth row of each sector is used as Parity of Outer-Code (PO). In other words, a 10-byte parity (PI) by Reed-Solomon (RS) Coding is added to one row of data of 172 bytes lined in the lateral direction, and a 16-byte parity (PO) by RS Coding is added to one column of data of 192 bytes lined in the vertical direction.

One ECC block, including 16 sectors, is recorded on the DVD 100 in the lateral direction sequentially. The number of each sector (sector address) in the ECC block can be specified by the 4-byte data at the head of the sector. This ECC block is the unit of error correction.

<Configuration of Data Reproduction Device>

Figure 3:
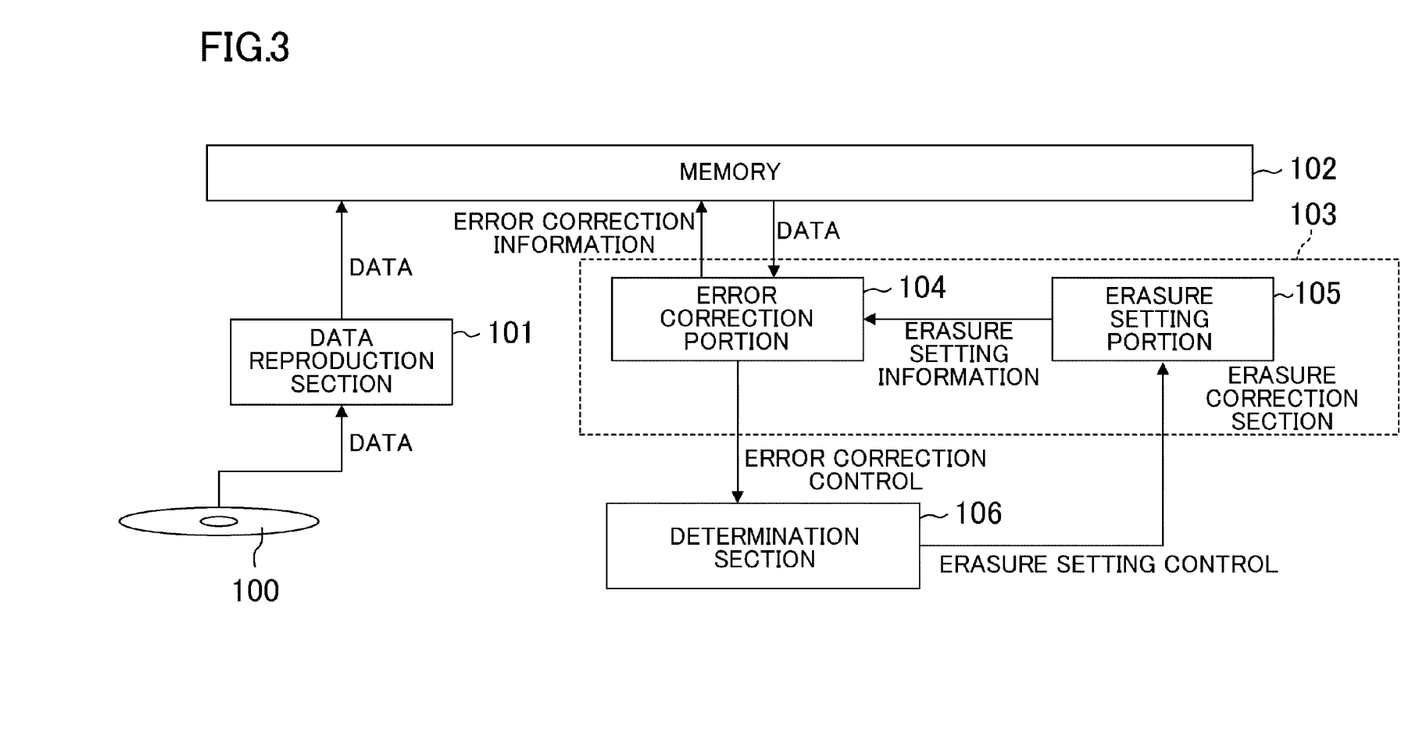
FIG. 3 is a block diagram of a data reproduction device of the first embodiment of the present disclosure.

As shown in FIG. 3, the data reproduction device of the first embodiment of the present disclosure includes a data reproduction section 101, a memory 102, an erasure correction section 103, and a determination section 106.

The data reproduction section 101 reproduces recording data from the DVD 100 sequentially while detecting the sync pattern (SY0) included in each sector and the sync pattern (SY0-SY7) included in each frame. There is a possibility that the data reproduction section 101 may detect SYNC at a position deviated from the position where it should be due to a defect, dust, etc. on the DVD 100. To prevent such an occurrence, the data reproduction section 101 interpolates position data (e.g., a frame address, a sector address, SYNC, and SY0) that has not been recorded normally on the DVD 100, based on position data obtained by reproducing the recording data again from the DVD 100 sequentially, and outputs the resultant (interpolated) data, and also outputs interpolation information indicating whether interpolation has been made for each position data unit (this is not shown in FIG. 3). For example, SYNC is checked at any time during reading of recording data, and, if SYNC is missing or deviated, SYNC data is interpolated at the SYNC missing position. In this way, the data reproduction section 101 can read the recording data.

The memory 102 holds the recording data reproduced by the data reproduction section 101.

The erasure correction section 103 executes an error correction step of performing error correction in the row direction (PI correction) and error correction in the column direction (PO correction) at least once for the ECC block that includes the recording data reproduced by the data reproduction section 101 arranged in the row direction sequentially over a plurality of rows.

The determination section 106 determines whether uncorrectable data is left behind after the execution of the error correction step by the erasure correction section 103.

If the determination section 106 determines that uncorrectable data is left behind, the erasure correction section 103 executes erasure correction processing of performing error correction in the column direction, considering data of 13 rows in the ECC block as erasure data, irrespective of the result of the error correction in the row direction. That is, even in cases where uncorrectable data in the error correction in the row direction is not left behind, the erasure correction section 103 performs error correction in the column direction, considering the 13-row data as erasure data, when the determination section 106 determines that uncorrectable data is left behind.

Specifically, the erasure correction section 103 includes an error correction portion 104 and an erasure setting portion 105.

The error correction portion 104 performs error correction for the recording data held in the memory 102. Also, the error correction portion 104 performs error correction in the column direction, considering data in rows specified by erasure setting information set by the erasure setting portion 105 as erasure data.

The erasure setting portion 105 sets the erasure setting information that specifies 13 rows in the ECC block (a column of 13 PI codes) when it is determined that uncorrectable data is left behind by the determination section 106.

<Operation of Data Reproduction Device>

The operation of the data reproduction device configured as described above will be described with reference to FIG. 4.

Figure 4:
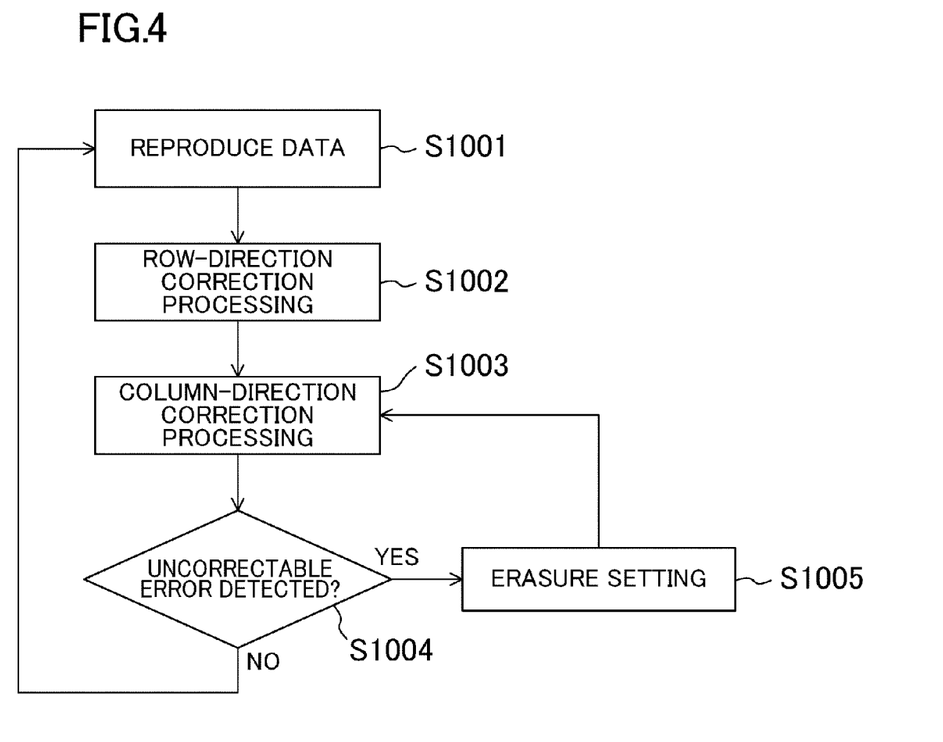
FIG. 4 is a flowchart showing the operation of the data reproduction device of the first embodiment of the present disclosure.

In (S1001), first, the data reproduction section 101 reproduces recording data from the DVD 100, one ECC block at a time, and stores the data into the memory 102. Then, n=1 is set.

In (S1002) and (S1003), the error correction portion 104 performs PI correction and PO correction as conventionally done for an ECC block that has the recording data reproduced by the data reproduction section 101 and held in the memory 102 arranged in the row direction. At this time, the error correction portion 104 enables or disenables an error correction control signal in accordance with whether the error correction was possible or not.

When the error correction control signal is enabled (rises), in (S1004), the determination section 106 determines whether uncorrectable data is left behind after the PO correction in (S1003). If there is uncorrectable data left behind, the determination section 106 enables (raises) an erasure setting control signal, to instruct the erasure setting portion 105 to set erasure setting information in (S1005). In response to this instruction, the erasure setting portion 105 sets erasure setting information specifying 13 lines of PI codes, i.e., the n-th to (n+12)th rows in the ECC block, and then n=n+13 is set.

Thereafter, in (S1003), the error correction portion 104 reads recording data from the memory 102 and performs PO correction for the read data, considering the data of the rows specified by the erasure setting information as erasure data. Once the error correction processing is terminated without problems, i.e., once the determination section 106 determines that there is no uncorrectable data left behind, the error correction portion 104 disenables (lowers) the error correction control signal, and the processing returns to (S1001). If the determination section 106 determines again that there is uncorrectable data left behind, the erasure setting portion 105 sets again erasure setting information specifying 13 lines of PI codes. The erasure setting information set this time specifies lines of PI codes descending by 13 rows from the lines of PI codes specified by the erasure setting information set last time.

In (S1001) (data reproduction step), if it is determined that an anomaly has occurred in a SYNC code and resynchronization is performed using the SYNC code, data read by the data reproduction section 101 will become incorrect, as in the conventional case. In this case, if data is incorrect because of a poor data recording state, failure at a data write link, etc., for example, the PO correction in (S1003) may fail to terminate normally, leaving uncorrectable data behind, although no uncorrectable data is left behind in the PI correction in (S1002). The reason why the determination section 106 detects that uncorrectable data is left behind after the PO correction in (S1004) although the PI correction has terminated normally is considered that incorrect data of 13 rows of one sector has been generated due to the resynchronization using the SYNC code. Therefore, by performing PO correction, considering data of 13 rows corresponding to one sector as erasure data, sequentially from the head of the ECC block read in (S1001), it is possible to prevent the occurrence of failing to reproduce data normally due to data error of one sector. In other words, by repeating PO correction and erasure setting the maximum 16 times (208 (number of rows of the ECC block)÷13 (number of rows of one sector)), the possibility that error correction can be completed normally can be enhanced.

When the memory quality of the DVD 100 is poor, or when data is edited or rewritten, there is a possibility that data stored in the buffer memory is incorrect due to wrong resynchronization caused by erroneous acquisition of SYNC even though the data stored in the buffer memory corresponds to its address. In this embodiment, however, since the error correction capability is enhanced as described above, the recording data recorded on the DVD 100 can be reproduced correctly with higher probability even when the data stored in the buffer memory is incorrect.

In this embodiment, although the number of rows specified by the erasure setting information from the erasure setting portion 105 is 13, it can be any number equal to or more than one if only data of such a number of rows can be corrected at one time of error correction.

In this embodiment, PO correction is performed in (S1003) immediately after the setting of the erasure setting information in (S1005). Alternatively, the processing may return to (S1001) after the setting of the erasure setting information, to read recording data. In other words, after the determination section 106 determines that there is uncorrectable data left behind and by the time when the erasure correction section 103 executes the erasure correction processing, the data reproduction section 101 may reproduce recording data again from the DVD 100 sequentially. The flow of operation in this case will be repeating retry of reproduction with the erasure setting information changed, like data read→PI correction→PO correction→erasure setting→data read→PI correction→PO correction→erasure setting→data read.

Also, in this embodiment, after the data reproduction section 101 reads data and stores the data into the memory 102, the error correction portion 104 performs PI correction and PO correction. Alternatively, after the data reproduction section 101 reads data and the error correction portion 104 performs PI correction, the PI-corrected data may be stored into the memory 102, and thereafter the error correction portion 104 may perform PO correction.

Second Embodiment

Figure 5:
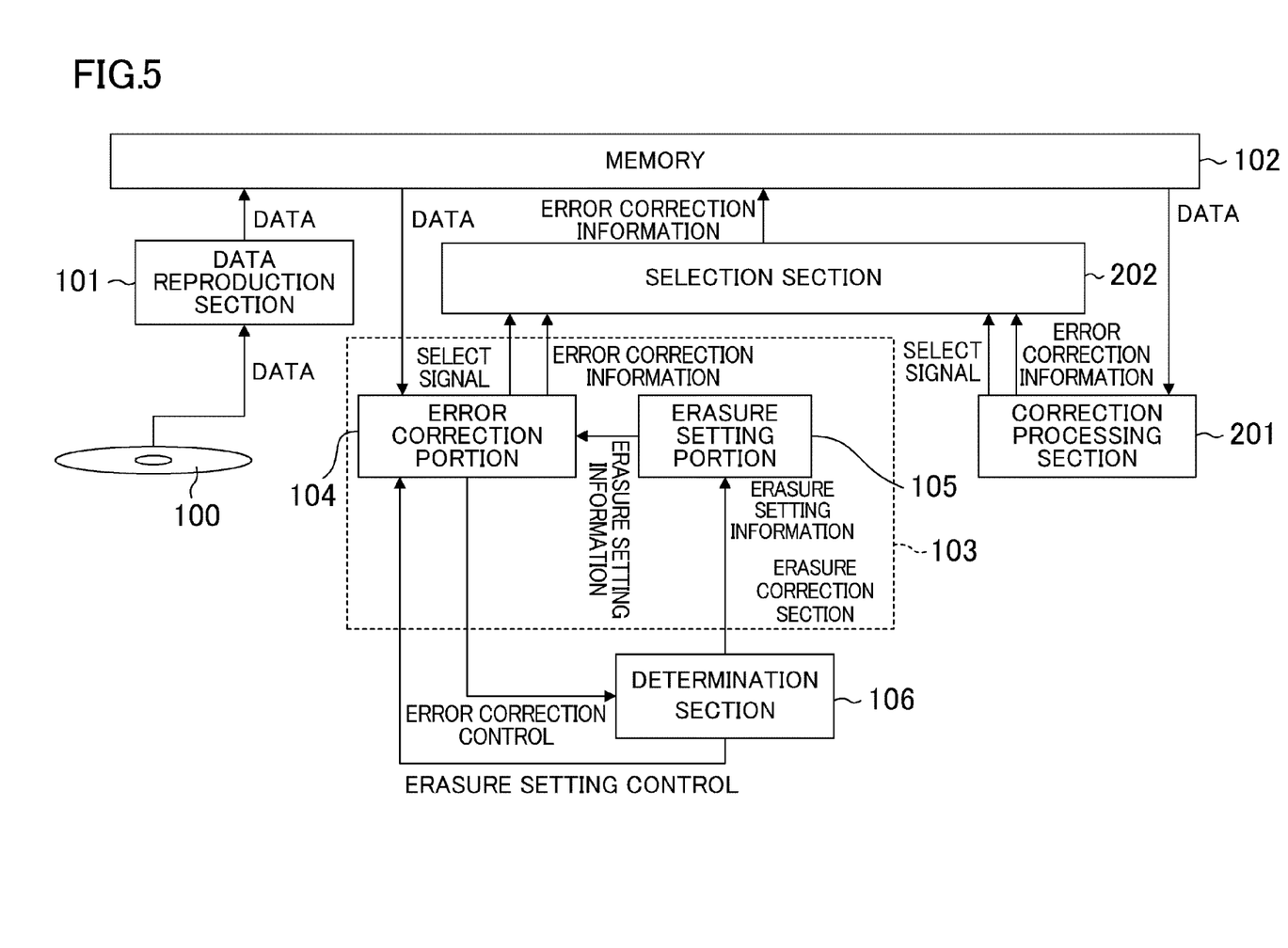
FIG. 5 is a block diagram of a data reproduction device of the second embodiment of the present disclosure.

As shown in FIG. 5, a data reproduction device of the second embodiment of the present disclosure includes a correction processing section 201 and a selection section 202 in addition to the components of the data reproduction device of the first embodiment.

The correction processing section 201 executes the conventional error correction. More specifically, the correction processing section 201 executes an error correction step of performing error correction in the row direction (PI correction) and error correction in the column direction (PO correction) at least once for the ECC block that has the recording data reproduced by the data reproduction section 101 arranged in the row direction sequentially over a plurality of rows.

The selection section 202 selects either error correction information output from the error correction portion 104 or error correction information (the position of error correction and correct data after the error correction) output from the correction processing section 201, based on a select signal indicating which error correction information, from the error correction portion 104 or from the correction processing section 201, is currently coming. Using the selected error correction information, error correction is performed for data stored in the memory 102. In other words, the selection section 202 selects which one, correction by the erasure correction section 103 (first correction processing) or correction by the correction processing section 201 (second correction processing), should be executed.

The operation of the data reproduction device of this embodiment configured as described above will be described with reference to FIG. 6.

Figure 6:
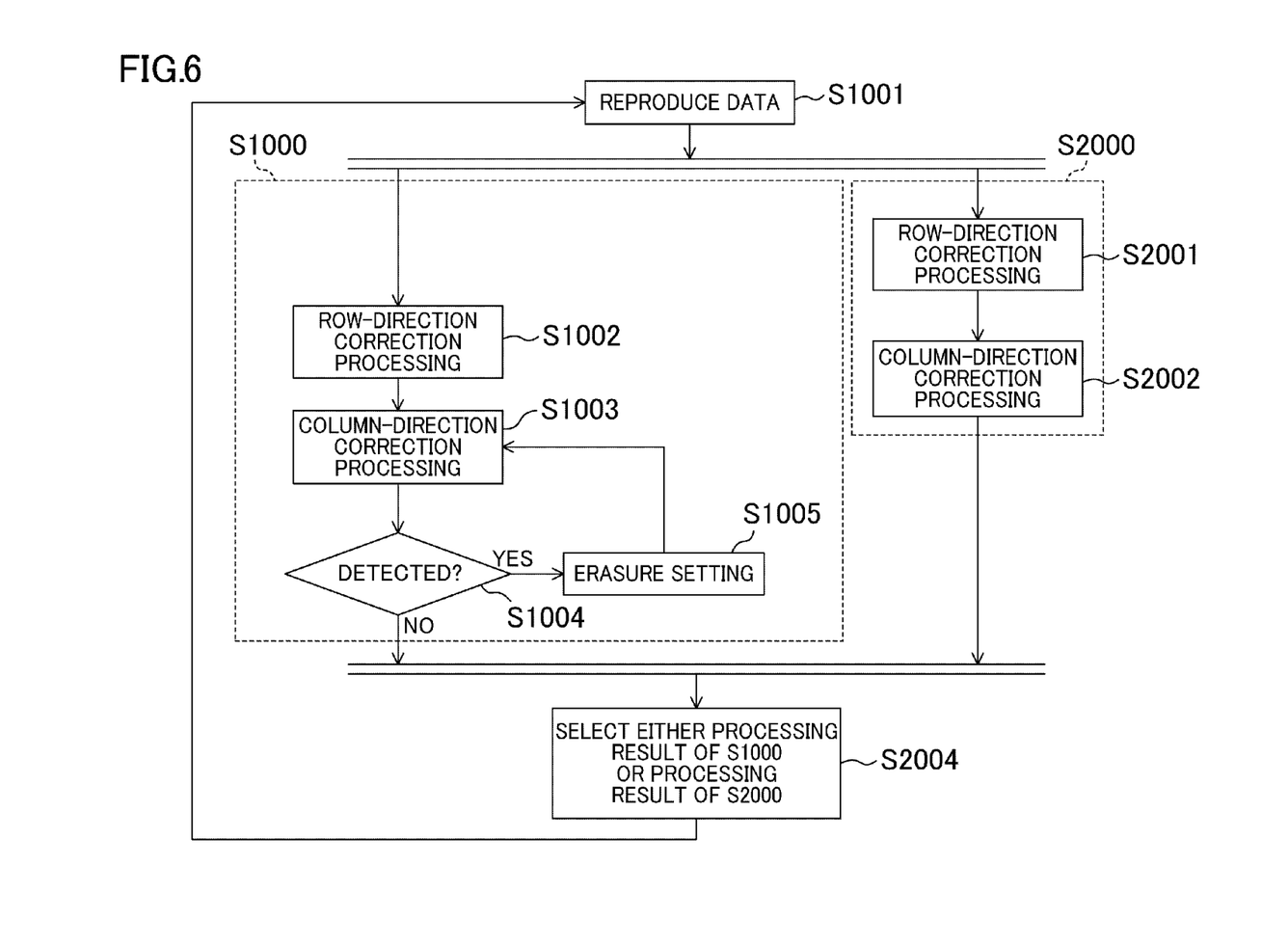
FIG. 6 is a flowchart showing the operation of the data reproduction device of the second embodiment of the present disclosure.

First, in (S1001), the data reproduction section 101 reads recording data from the DVD 100, one ECC block at a time, and stores the data into the memory 102. Subsequently, in (S1002), (S1003), (S2001), and (S2002), the error correction portion 104 and the correction processing section 201 read data stored in the memory 102 and perform PI correction and PO correction. The correction processing section 201 executes PI correction and PO correction at least once, and then shifts its processing to the next ECC block. Note that the number of times of execution of PI correction and PO correction is not limited to one, but the correction processing section 201 may perform PI correction and PO correction a plurality of times for data having many errors.

In this embodiment, after the data reproduction section 101 reads data and stores the data into the memory 102, the error correction portion 104 and the correction processing section 201 perform PI correction and PO correction. Alternatively, after the data reproduction section 101 reads data and the error correction portion 104 or the correction processing section 201 performs PI correction, the PI-corrected data is stored into the memory 102, and thereafter the error correction portion 104 and the correction processing section 201 may perform PO correction.

If the determination section 106 enables (raises) the erasure setting control signal in (S1004), the erasure setting portion 105 sets erasure setting information in (S1005) as in the first embodiment. Thereafter, the error correction portion 104 performs PO correction, whereby uncorrectable data can be rendered error correctable, and thus the recording data can be reproduced normally with more reliability.

The processing in (S1000) including the steps (S1002) to (S1005) (first correction processing) and the processing (S2000) including the steps (S2001) and (S2002) (second correction processing) are executed in parallel.

In (S2004), the selection section 202 selects either the processing result in (S1000) and the processing result in (S2000). More specifically, the selection section 202 selects either error correction information output from the error correction portion 104 or error correction information (the position of error correction and correct data after the error correction) output from the correction processing section 201, based on a select signal indicating which error correction information, from the error correction portion 104 or from the correction processing section 201, is currently coming. Using the selected error correction information, error correction is performed for data stored in the memory 102. The error correction portion 104 disables (lowers) the error correction control signal at the time of termination of the error correction processing without problems.

In order to respond to a situation where the error correction portion 104 must perform a number of error corrections in a short time, pseudo space may be provided for holding a plurality of erasure setting information units, erasure setting control signals, etc.

This embodiment can provide an advantage that the number of retries can be reduced by performing corrections different in error correction conditions using the correction processing section 201 that performs the conventional error correction and the error correction portion 104 in parallel, in addition to the advantage of enhancing the error correction capability in the first embodiment.

In this embodiment, data stored in the memory 102 is read by the error correction portion 104 and the correction processing section 201. Alternatively, the error correction portion 104 may be placed downstream of the correction processing section 201. This eliminates the necessity of the error correction portion 104 performing the conventional error correction and further can reduce the number of retries.

Third Embodiment

Figure 7:
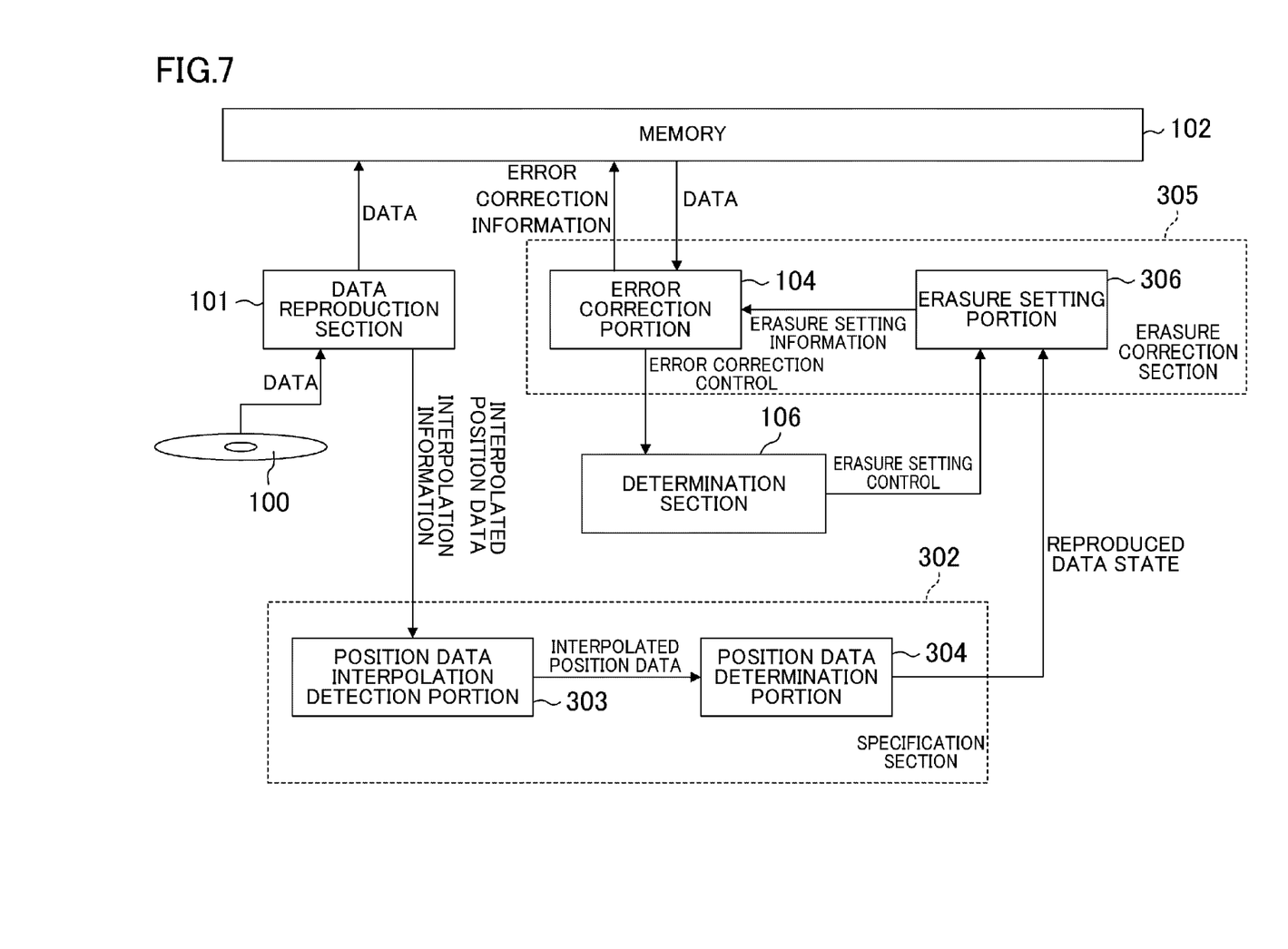
FIG. 7 is a block diagram of a data reproduction device of the third embodiment of the present disclosure.

FIG. 7 shows a data reproduction device of the third embodiment of the present invention.

The data reproduction device of this embodiment includes a specification section 302 that specifies the position of a data unit including interpolated position data in an ECC block based on position data and interpolation information output from the data reproduction section 101.

The specification section 302 includes a position data interpolation detection portion 303 and a position data determination portion 304.

The position data interpolation detection portion 303 retrieves interpolated position data based on position data and interpolation information output from the data reproduction section 101.

The position data determination portion 304 specifies where the interpolated position data is in the ECC block, and outputs position information indicating the position of the interpolated position data in the ECC block.

Also, an erasure setting portion 306 of an erasure correction section 305 sets erasure setting information based on, not only the determination result of the determination section 106, but also the position information output from the position data determination portion 304.

The operation of the data reproduction device of this embodiment configured as described above will be described.

First, the operation of setting erasure setting information using a sector address, out of the position data output from the data reproduction section 101, will be described. When receiving sector addresses, SY0, and interpolation information from the data reproduction section 101, the position data interpolation detection portion 303 extracts a sector address at the position where the interpolation information indicates presence of interpolation (rises) at the timing of SY0, and discards any sector address at the position where the interpolation information indicates absence of interpolation (falls). Note that the sector address and SY0 are position data indicating the position of a sector (data unit) on the DVD 100.

Then, the position data determination portion 304 specifies the state (position information in the ECC block, i.e., sector addresses in the ECC block) of the reproduced data based on the data output from the position data interpolation detection portion 303. Thereafter, the erasure setting portion 306 sets erasure setting information using the position information output from the position data determination portion 304 when the erasure setting control signal output from the determination section 106 is in the enabled state (high). The erasure setting information set at this time specifies a specific sector in the ECC block, which corresponds to 13 rows (1 sector=13 rows). Note however that, if interpolation has been performed two or more times, rows of two or more multiple of 13 may be specified in some cases. More specifically, the erasure setting information set at this time specifies 13 rows corresponding to a sector where at least either its sector address or SY0 has been interpolated.

Next, the operation of setting erasure setting information using a frame address will be described. When receiving frame addresses, SYNC, and interpolation information from the data reproduction section 101, the position data interpolation detection portion 303 extracts a frame address at the position where the interpolation information indicates presence of interpolation (rises) at the timing of SYNC, and discards any frame address at the position where the interpolation information indicates absence of interpolation (falls). Note that the frame address and SYNC are position data indicating the position of a frame (data unit) on the DVD 100.

Then, the position data determination portion 304 specifies the state (position information in an ECC block, i.e., frame addresses in the ECC block) of the reproduced data based on the data output from the position data interpolation detection portion 303. Thereafter, the erasure setting portion 306 sets erasure setting information using the position information output from the position data determination portion 304 when the erasure setting control signal output from the determination section 106 is in the enabled state (high). The erasure setting information set at this time specifies specific lines of PI codes in the ECC block. More specifically, the erasure setting information set at this time specifies a row including a frame where at least either its frame address or SYNC has been interpolated.

As described above, in this embodiment, it is possible to estimate the recording position of incorrect data using an interpolated sector address or frame address and perform error correction considering data at the estimated recording position as erasure data. Therefore, compared with the first embodiment, the number of times of error correction performed at and after setting of erasure setting information by the erasure setting portion 306 can be widely reduced, and thus the time required for reproduction of data can be shortened. Also, in the case of correction processing following the flow of data read→PI correction→PO correction→specification of erasure data position→data read→PI correction→erasure setting→PO correction→next data read (retry processing), the time required for reproduction of data can be shortened further effectively with reduction in the number of times of error correction.

In this embodiment, an example of operation of setting erasure setting information using either a sector address or a frame address is described. Alternatively, both the sector address and the frame address may be used to calculate the position data in one ECC block (output of the position data determination portion 304) more correctly, setting the erasure setting information using both addresses. This can further shorten the time required for error correction.

In this embodiment, the erasure setting portion 306 uses the position information output from the position data determination portion 304 when the erasure setting control signal output from the determination section 106 is in the enabled state (high). Alternatively, interpolation information output from the position data determination portion 304 may be used.

Although sector addresses, frame addresses, SYNC, and SY0 are used as examples of the position data in this embodiment, other types of position information and sync signals may be used in place of the above examples.

Fourth Embodiment

Figure 8:
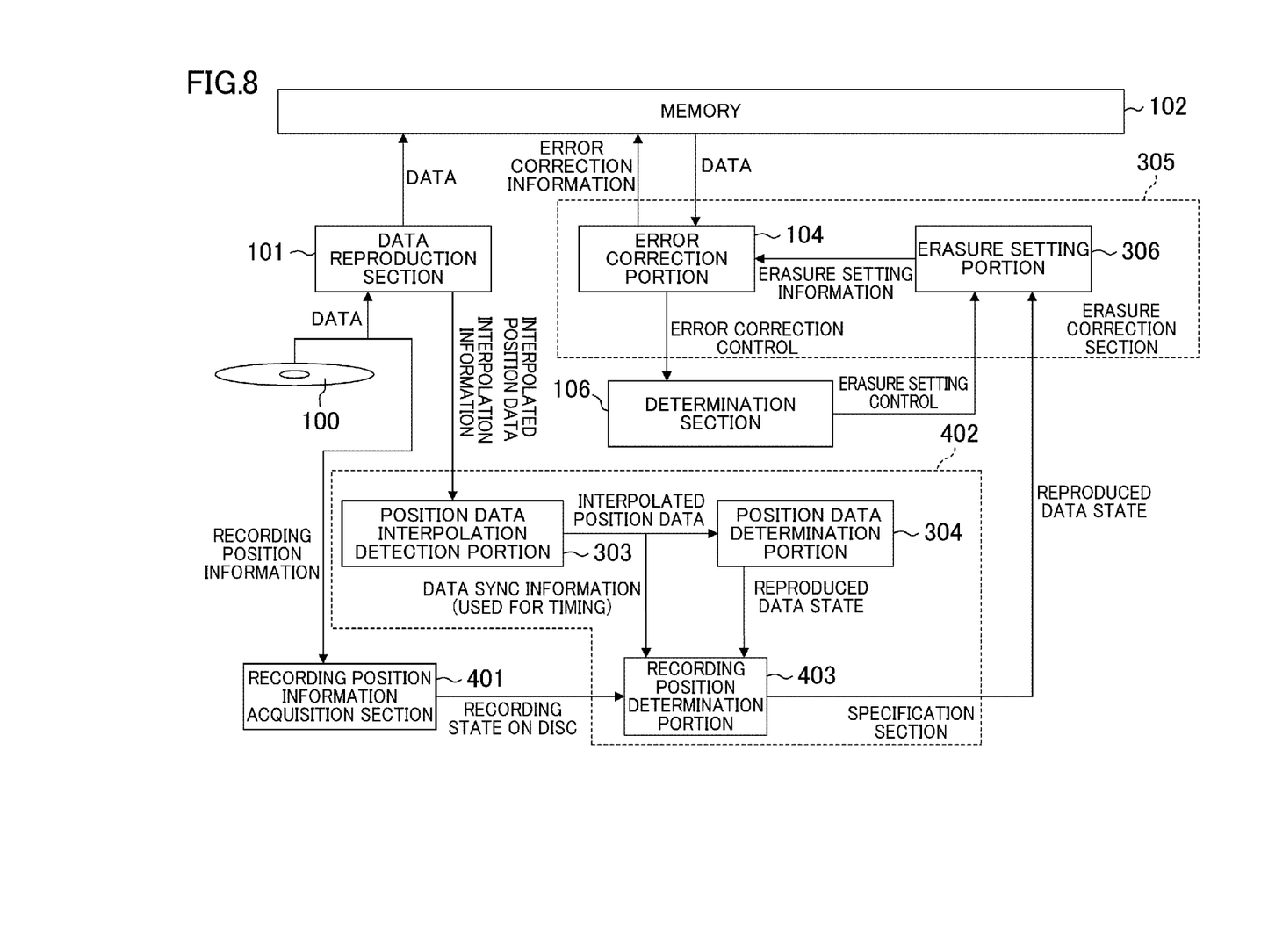
FIG. 8 is a block diagram of a data reproduction device of the fourth embodiment of the present disclosure.

As shown in FIG. 8, a data reproduction device of the fourth embodiment includes a recording position information acquisition section 401 in addition to the components of the data reproduction device of the third embodiment, and includes a specification section 402 in place of the specification section 302 in the third embodiment.

The recording position information acquisition section 401 reads physical information (e.g., CAPA, LPP, etc.) written previously on the DVD 100, and converts the physical information to a physical address that is recording position information on the DVD 100.

The specification section 402 includes a recording position determination portion 403 in addition to the components of the specification section 302 in the third embodiment.

The recording position determination portion 403 compares the physical address acquired by the recording position information acquisition section 401 with the state (position information in the ECC block) of reproduced data output from the position data determination portion 304 using the sync pattern detected by the data reproduction section 101, and specifies the correct state (position information in the ECC block) of the reproduced data based on the comparison result.

For example, the recording position determination portion 403 receives a sync pattern (e.g., SYNC and SY0) detected by the data reproduction section 101 and output from the position data interpolation detection portion 303, a physical address acquired by the recording position information acquisition section 401, and a sector address output from the position data determination portion 304, and compares the physical address with the sector address (an example of a reproduced data state signal) in the ECC block at the timing of the sync pattern. If the sector address output from the position data determination portion 304 is different from the sector address in the ECC block calculated based on the physical address acquired by the recording position information acquisition section 401 and the recording position information recorded previously on the DVD 100, the recording position determination portion 403 corrects the sector address output from the position data determination portion 304 into the sector address calculated based on the physical address and the recording position information. The erasure setting portion 306 sets erasure setting information based on the corrected sector address.

In this embodiment, in which erasure setting information is generated using the position information recorded on the DVD 100, the error position can be specified more precisely, and thus the number of times of repetition of error correction can be reduced. As a result, the time required for data reproduction can be shortened. Also, in the case of correction processing following the flow of data read→PI correction→PO correction→storing of recording position and erasure setting information→data read→PI correction→erasure setting→PO correction→next data read (retry processing), the time required for data reproduction can be shortened further effectively with reduction in the number of times of error correction.

The correction processing by the recording position determination portion 403 as described above is applicable, not only to the sector address, but also to other types of position information such as the frame address. When both the sector address and the frame address are used for setting of erasure setting information, the correction processing by the recording position determination portion 403 may be performed for both the sector address and the frame address.

Although the DVD 100 is used as the recording medium in the first to fourth embodiments, the present disclosure is also applicable to use of recording media other than the DVD 100.

The error correction method and the data reproduction device of the present disclosure have an advantage of permitting such error correction that has been conventionally unattainable and thus being able to reproduce data normally with higher probability, and therefore are useful as an error correction method, and a data reproduction device, of performing error correction for recording data read from a recording medium.

What is claimed is:
1. An error correction method, comprising:
a data reproduction step of reproducing recording data, constituted by a plurality of data units each made of a plurality of bits, from a recording medium sequentially while detecting a sync pattern included in each data unit;
an error correction step of performing error correction in a row direction and error correction in a column direction at least once for an error correction code block in which the plurality of data units reproduced in the data reproduction step are arranged in the row direction over a plurality of rows;
a determination step of determining whether uncorrectable data is left behind after execution of the error correction step; and
an erasure correction step of performing, when it is determined that uncorrectable data is left behind in the determination step, error correction in the column direction considering data constituting at least one row of the error correction code block as erasure data, even in a case where uncorrectable data in the error correction in the row direction is not left behind.
2. The error correction method of claim 1, wherein
in the data reproduction step, recording data of a plurality of error correction code blocks is reproduced,
first correction processing and second correction processing are performed in parallel, the first correction processing being executing the error correction step, the determination step, and the erasure correction step and the second correction processing being executing only the error correction step, and the method further comprises a selection step of selecting the first correction processing or the second correction processing to be executed for each of the error correction code blocks.

3. The error correction method of claim 1, further comprising:
when it is determined that uncorrectable data is left behind, a second reproducing step of reproducing the recording data again from the recording medium sequentially by the time when the erasure correction processing is executed.

4. The error correction method of claim 1, wherein:
each data unit includes position data indicating a position of the each data unit,
the method further comprises:
an interpolating step of interpolating position data that has not been recorded normally on the recording medium based on position data obtained by reproducing the recording data again from the recording medium sequentially;
an output step of outputting the interpolated position data, and interpolation information indicating whether interpolation has been made for each position data; and
a specification step of specifying the position of a data unit including the interpolated position data in the error correction code block based on the position data and the interpolation information, and
data considered as erasure data in the erasure correction step is data of a row including the data unit of which the position has been specified in the specification step.

5. The error correction method of claim 4, wherein
the error correction code block is constituted by a plurality of first data groups, and each of the first data groups is constituted by a plurality of second data groups,
the data unit is the first data group, and
the position data indicates the position of the first data group in the error correction code block.

6. The error correction method of claim 4, wherein
the error correction code block is constituted by a plurality of first data groups, and each of the first data groups is constituted by a plurality of second data groups,
the data unit is the second data group, and
the position data indicates the position of the second data group in the first data group.

7. The error correction method of claim 4, further comprising:
a recording position information acquisition step of acquiring a physical address recorded on the recording medium,
wherein the physical address acquired in the recording position information acquisition step is compared with the position data interpolated in the data reproduction step using the sync pattern detected in the data reproduction step, and specifying the position of the data unit including the interpolated position data in the error correction code block based on the comparison result.

8. A data reproduction device comprising:
a data reproduction section configured to reproduce recording data, constituted by a plurality of data units each made of a plurality of bits, from a recording medium sequentially while detecting a sync pattern included in each data unit;
an erasure correction section configured to execute an error correction step of performing error correction in a row direction and error correction in a column direction at least once for an error correction code block in which the plurality of data units reproduced by the data reproduction section arranged in the row direction over a plurality of rows; and
a determination section configured to execute a determination step of determining whether uncorrectable data is left behind after execution of the error correction step, wherein
the erasure correction section executes, when the determination section determines that uncorrectable data is left behind, erasure correction processing of performing error correction in the column direction considering data constituting at least one row of the error correction code block as erasure data, even in a case where uncorrectable data in the error correction in the row direction is not left behind.

9. The data reproduction device of claim 8, wherein
when the determination section determines that uncorrectable data is left behind, the data reproduction section reproduces the recording data again from the recording medium sequentially by the time when the erasure correction section executes the erasure correction processing.

10. The data reproduction device of claim 8, further comprising:
a correction processing section configured to execute the error correction step; and
a selection section configured to select either a combination of the error correction step by the erasure correction section, the determination step by the determination section, and the erasure correction processing by the erasure correction section or the error correction step by the correction processing section.

11. The data reproduction device of claim 8, wherein
each data unit includes position data indicating a position of the each data unit,
the data reproduction section interpolates position data that has not been recorded normally on the recording medium based on position data obtained by reproducing the recording data again from the recording medium sequentially and outputs the interpolated position data, and also outputs interpolation information indicating whether interpolation has been made for each position data,
the data reproduction device further comprises a specification section configured to specify the position of a data unit including the interpolated position data in the error correction code block based on the position data and the interpolation information output from the data reproduction section, and
data considered as erasure data by the erasure correction section is data of a row including the data unit of which the position has been specified by the specification section.

12. The data reproduction device of claim 11, wherein
the error correction code block is constituted by a plurality of first data groups, and each of the first data groups is constituted by a plurality of second data groups,
the data unit is the first data group, and
the position data indicates the position of the first data group in the error correction code block.

13. The data reproduction device of claim 11, wherein
the error correction code block is constituted by a plurality of first data groups, and each of the first data groups is constituted by a plurality of second data groups,
the data unit is the second data group, and
the position data indicates the position of the second data group in the first data group.

14. The data reproduction device of claim 11, further comprising:
  a recording position information acquisition section configured to acquire a physical address recorded on the recording medium,
wherein
  the specification section compares the physical address acquired by the recording position information acquisition section with the position data interpolated by the data reproduction section using the sync pattern detected by the data reproduction section, and specify the position of the data unit including the interpolated position data in the error correction code block based on the comparison result.

* * * * *